United States Patent [19]

Scrutton et al.

[11] 4,234,673

[45] Nov. 18, 1980

[54] MANUFACTURE OF SIGNS USING PHOTOIMAGING AND HEAT TRANSFER

[75] Inventors: Simon L. Scrutton; John V. Shepherd; John S. Thornley, all of London, England; Eric M. Sutton, Nairobi, Kenya

[73] Assignee: Letraset Corporation, Paramus, N.J.

[21] Appl. No.: 971,447

[22] Filed: Dec. 20, 1978

[30] Foreign Application Priority Data

Dec. 21, 1977 [GB] United Kingdom ............... 53243/77

[51] Int. Cl.³ ........................ G03C 11/12; G03C 5/00
[52] U.S. Cl. .................................... 430/252; 430/254; 430/256; 430/260; 430/329; 430/330; 156/230; 156/235; 156/247
[58] Field of Search ......................... 96/28, 38.2, 38.3; 430/252, 254, 260, 329, 330, 256; 156/230, 235, 247

[56] References Cited

U.S. PATENT DOCUMENTS

| | | | |
|---|---|---|---|
| 3,481,736 | 12/1969 | Ruff | 96/28 |
| 3,563,742 | 2/1971 | Philpot et al. | 96/28 |
| 3,615,435 | 10/1971 | Chu et al. | 96/28 |
| 3,639,123 | 2/1972 | Gray | 96/28 |
| 3,721,557 | 3/1973 | Inoue | 96/28 |
| 3,904,411 | 9/1975 | Erickson et al. | 96/28 |

*Primary Examiner*—Jack P. Brammer
*Attorney, Agent, or Firm*—Darby & Darby

[57] ABSTRACT

A method of making signs is disclosed in which a photographically sensitive material is imagewise exposed and developed. The developed image is so constituted that, under the action of heat and pressure, it may be made to adhere to a surface of a transparent or translucent sheet, e.g. of plastics or glass, to form a sign in which the legend is visible through and protected by the sheet. In order to render the legend more visible, a coating or layer may be applied over the legend which accordingly forms a background to the legend as viewed through the sheet.

Production of the legend photographically gives very great flexibility in terms of letter size, spacing and the like and allows the production of "one off" signs on a rapid and economic basis. A simple hot press may be used to adhere the legend to the sign sheet.

14 Claims, No Drawings

MANUFACTURE OF SIGNS USING PHOTOIMAGING AND HEAT TRANSFER

This invention relates to the manufacture of signs.

It is known to manufacture signs by the use of transfer letter applied to a substrate such as a sheet of wood, metal, glass or plastics. Such signs are unsatisfactory since the lettering is liable to degrade if subjected to abrasion, weathering and the like.

It has recently been proposed to manufacture signs by assembling the desired legend using a dry transfer material on an intermediate support and then transferring the so assembled legend on to the rear side of a transparent or translucent plastics sheet through which the legend is then viewed. The sheet itself accordingly acts to protect the legend from adverse influences. The legend is preferably formed of a material which can be heat sealed on to the transparent or translucent sheet.

Such methods have certain disadvanatages: first of all, there is the requirement for a preformed dry transfer material and this places a restriction on the sign maker. Thus commercial dry transfer materials are only produced in certain typefaces and each of those typefaces is only produced in certain sizes. Special sheets of dry transfer material have to be manufactured if it is desired to use as part of the legend logotypes or other symbols such as company housemarks. A further difficulty is in some cases the question of aligning the individual letters or the like making up the legend.

According to the present invention there is provided a method of manufacturing a sign which comprises forming a legend photographically by imagewise exposure and development of a photographically sensitive material, the material of the legend being adherable under the action of heat and pressure to one surface of a transparent or translucent sheet of material, and adhering the so-formed legend to such a sheet of material.

Within this general method there are two major specific methods of manufacturing signs. In the first of these, a dry transfer material is made by imagewise exposure and development of an appropriately sensitised material. The dry transfer material is then used to transfer the legend on to an intermediate temporary support, e.g. a sheet of plastics film such as polyethyleneterephthalate, whereafter the intermediate support bearing the legend is passed together with the transparent or translucent sheet (usually a plastics sheet) through a heated nip to transfer the legend on to the surface of the transparent or translucent sheet. Thereafter the temporary carrier may simply be removed and discarded.

Alternatively, the desired final image may be generated directly from a sensitised material comprising a carrier foil and a photosensitive layer, wherein the photosensitive layer after imagewise exposure and development can be adhered to the surface of a transparent or translucent sheet more strongly than the layer adheres to the carrier foil of the photosensitive material.

Referring to the first of these techniques a number of processes have been proposed for the manufacture of dry transfer material, particularly dry transfer lettering sheets, by photographic means. British Pat. Spec. Nos. 1,079,661, 1,291,960, 1,364,627 and 1,441,982 disclose such methods. If such materials are used in the process of the present invention, care needs to be taken in order to ensure that the developed images will adhere more strongly under the effect of heat and pressure to the surface of a transparent or translucent sheet than those images adhere to the carrier sheet. Adherence to the transparent or translucent sheet may generally by ensured by providing that the polymeric base of the photosensitive layer is a thermoplastic polymer or by providing in some other way that the portions of the photosensitive layer, after exposure and development, have heatseal adhesive properties.

The dry transfer material may be one which requires an applied adhesive layer in order to function or it may be one in which the adhesive layer is automatically obtained on imagewise exposure and development of the photosensitive material. The release of the exposed and developed images from the carrier sheet is preferably not effected by means of or with the assistance of a fracturable so-called release layer, since traces of such release layer tend to be present on the transferred image and generally do not enhance the ability with which that transferred image can then be subsequently transferred under the action of heat and pressure to the surface of the transparent or translucent sheet to form the sign. If it is desired to use such a release layer, it should be of a material having heatseal properties.

Using the second method noted above, a photosensitive material is used which after exposure and development consists of a carrier sheet on which is located the desired legend as one or more areas of a transferable layer. That layer may be transferable under the effect of heat and pressure by virtue of its adhering under such conditions more strongly to the surface of a transparent or translucent sheet than the layer adheres to the original carrier material of the photosensitive material.

The transparent or translucent sheet to which the legend is adhered under the action of heat and pressure may be a glass sheet but is preferably a plastics sheet, particularly of polyvinyl chloride or of polymethylmethacrylate plastics such as that sold under the Trade Marks PERSPEX and PLEXIGLAS.

The generation of the legend which is to be heat adhered to the transparent or translucent sheet to form the sign by photographic methods gives flexibility in sign manufacture. If the sign is to consist simply of letters and punctuation marks i.e. customary typographical symbols to be found in any typographic font, then the legend may conveniently be assembled using a photosetting machine of known type. Use of such apparatus ensures correct horizontal alignment and spacing of the individual letters, punctuation marks etc. which greatly enhances the appearance of the finished sign. Use of such apparatus also enables the size of the legend to be chosen at will and the range of typefaces available as film fonts for use in typesetting machines is very wide. If the sign is to contain one or more symbols, these may be produced photographically using conventional process camera apparatus and if desired, by masking, a combination of process camera work and phototypesetting can be used. By the use of appropriate photographically sensitised materials it is possible to produce legends in black, white or a range of colours, the colours either being produced directly or being product in situ e.g. by producing the legend in white and subsequently dying the white letters using sublimation dyestuffs, an applied dye solution or colouring the letters by the use of a coloured blocking foil.

It should be observed that in either of the above methods, the desired legend may be produced on an appropriate photosensitive material directly by assembly using process camera or photosetting apparatus techniques or the legend may be produced in the form of a photographic negative or positive using such apparatus which is then contact printed on to a suitable photosensitive material which after development provides the transferable image.

After the image has been transferred on to the surface of the transparent or translucent sheet, the sign may be completed by providing a background to the legend, e.g. a coating of paint or the like over the legend and over the surface of the transparent or translucent sheet or a backing paper held against such surface or a plastics film or foil laminated thereto by a layer of adhesive. If desired, the sheet may be provided with a suitable frame to constitute a finished sign.

The following Examples will serve to illustrate the invention.

EXAMPLE 1

A photosensitive material was made by successively coating and drying a release coat, a photopolymer layer and an adhesive coat on a 0.075 mm thick sheet of polyethyleneterephthalate.

The release coat consisted of the following ingredients in the following proportions by weight:

| | |
|---|---|
| high molecular styrenebutadiene polymer | 9 parts by weight |
| finely divided silica | 2 parts by weight |
| hydrocarbon wax (melting point 50°-100° C.) | 1 part by weight |
| toluene | 88 parts by weight |

The ingredients were dissolved and dispersed with a high shear stirrer, coated at a rate of 0.8 gsm on to the polyethylene terephthalate carrier sheet and the toluene evaporated at 90° C. using a forced hot air drier.

The coating composition for the photopolymer layer was prepared was follows:

7.8 Parts by weight of carbon black were mixed together with 23.45 parts by weight of a 12.5% solution of polyvinyl alcohol (Moviol 8.88 ex Harco Chemical Co.) in water and the mixture was then ground on a triple roll mill to Hegman gauge 7. To the dispersion so obtained there were added a further 27.5 parts of an aqueous solution of Moviol 8.88 (25% by weight), 12.5 parts of polyvinyl acetate copolymer (Mowilith LP 5400 ex Harco) and 15.0 parts polyvinyl acetate copolymer (Vinnapas 50/5VL ex Wacker Chemie). The mixture was stirred to homogeneity using a low shear stirrer and the pH then adjusted to 2.2 using normal hydrochloric acid.

In order to sensitise the emulsion so-obtained there were added 10 parts by weight of a 5% aqueous solution of a diazo resin (diazo ZAL ex ABM Chemicals).

This coating composition was applied using a Meyer bar on to the top of the release coat to give a coating weight after drying of 6 gsm. Drying was carrier out at a maximum temperature of 45° C. using a warm air drier.

In order to manufacture the adhesive, the following ingredients were milled together on a triple roll mill in the proportions given:

| | |
|---|---|
| Aromasol H (ex ICI) | 170 parts |
| Alpha Pinene resin (Piccolyte A125, 50% by weight solution in Aromasol H) | 320 parts |
| Wetting agent (Product 963 ex Henkel) | 1 part |
| Polyvinyl ethyl ether (EHBC ex Union Carbide) | 570 parts |
| Polyvinyl ethyl ether (EHBM ex Union Carbide) | 160 parts |
| Finely divided silica (Aerosil 300 ex Degussa) | 160 parts |

This mixture was diluted with 2760 parts of an aliphatic solvent (Cas 20/2 ex Carless, Capel and Leonard) to give a coatable adhesive solution. This was coated on to the polyethyleneterephthalate sheets to give a dried down coating weight of 1 to 1.8 gsm, depending upon the tack required. The adhesive layer was dried at a temperature of not greater than 45° C. using a forced warm air drier.

In order to make a sign, a photographic negative of the desired legend was produced in known fashion using a photosetting machine. This negative was then held in contact with a sheet of photosensitive material produced as just described in a vacuum frame and the photosensitive material exposed through the negative and through its polyethyleneterephthalate sheet to a 2 Kw mercury metal halide lamp for 15 seconds. The lamp was 60 centimeters away from the photosensitive material.

The photosensitive material was then washed with a cold water spray to leave a positive legend thereon, each element of which consisted of an individually transferable character.

A temporary carrier foil of polyethyleneterephthalate was then taken and the legend transferred thereto by rubbing over the back of the carrier sheet using a stylus in the area of each character of the legend. The adhesive layer adhered the characters to the polyethyleneterephthalate temporary carrier sheet which was 0.075 mm thick.

A sheet of polymethylmethacrylate plastics 2 mm thick was then placed on top of the legend on the temporary carrier sheet and the assembly of temporary carrier sheet, legend and polymethylmethacrylate sheet then passed between a pair of rubber rollers maintained at a temperature of 160° C. Passage speed was 1.7 meters/minute.

The temporary polyethyleneterephthalate carrier sheet was then stripped away to leave the individual characters of the legend adhered to the polymethylmethacrylate sheet. The legend was the right way round when viewed through that sheet and was clean in appearance. In order to provide a background for the legend, an overall layer of colour was applied to the surface of the polymethylmethacrylate sheet using a blocking foil.

EXAMPLE 2

A photosensitive material was made up as follows:

The carrier sheet was a polyethyleneterephthalate film (Melinex S ex ICI) and this was coated with a release layer using a 0.25 mm wire wound bar. After coating the layer was dried and cured by heating to 100° C. for four minutes. The coating composition was made by first neutralising a polyester resin (L5203 ex B.I.P.) using aminomethyl propanol. 50 parts by weight of this resin were then mixed with 32.5 parts by weight of an amino resin (Beetle amino resin BE336 ex B.I.P.) and the mixture catalysed by the addition of 9 parts by weight of a 25% by weight solution in water of paratoluene sulphonic acid.

The photosensitive layer applied thereover was made by triple roll milling together 20 parts by weight of carbon black (Elftex 150 ex Cabot) together with 80 parts by weight of a solution of polyvinyl alcohol (Moviol 8.88, 12.5% by weight solution in water ex Harlow Chemical Co.).

After roll milling to Hegman gauge 7, there were added 10 parts by weight of a pigment dispersion, 50 parts by weight of a PVA emulsion (Vinnapas D50G ex Wacker Chemie) 20 parts by weight of polyvinyl acetate copolymer emulsion (Vinnapas 50/5VL ex Wacker Chemie) 10 parts by weight of a diazo resin (ZAL diazo resin, as 5% by weight solution in water, ex ABM) and 6 parts by weight water.

This photopolymer layer was coated on to the release layer using a Meyer bar to give a dry coating weight after forced warm air drying at a temperature of no greater than 45° C. of 6 gsm.

In order to manufacture signs, sheets of the photosensitive material so made were exposed in contact with negatives of the desired sign. Exposure took place through the negative and via the polyethylene terephthalate base sheet and was carried out using a 2 Kw mercury metal halide lamp. Exposure time was 15 seconds and the lamp was 60 centimeters away from the photosensitive material.

After exposure, development took place by cold water spraying of the photosensitive material and subsequent drying.

The characters so formed could be transferred on to the surface of a polymethylmethacrylate sheet by passing the imagewise exposed and developed photosensitive material together with a polymethylmethacrylate sheet through a heated nip between two rubber rollers. The surface temperature of the rubber rollers was 160° C. and after passage through the nip the polyethyleneterephthalate base sheet could be stripped away together with the release layer to leave the characters forming the legend firmly adherent to the polyethyleneterephthalate sheet.

In order to finish the sign, the legend was backed either using a blocking foil or using a coloured card or film and if desired a frame may be mounted about the sheet.

EXAMPLE 3

A photosensitive, white coating was made by mixing the following compounds together in the proportions by weight noted:

| | | |
|---|---|---|
| Solution of 50% benzildimethyl ketal (Irgacure 651 ex CIBA-GEIGY) in Acetone | 4.4 | parts |
| Water | 29.5 | parts |
| Polyvinyl acetate homopolymer (Mowilith DHL ex Harlow Chemicals Ltd) | 8 | parts |
| Polyvinyl acetate copolymer (Vinnapas 50/5VL ex Wacker Chemie GmbH) | 11 | parts |
| 65% by weight TiO₂ dispersion in water | 8 | parts |
| Polyvinyl alcohol solution (25% by weight in water; Gohsenol GL03 ex Nippon Gohsei) | 8.1 | parts |
| Acrylic copolymer containing pendant glycidyl methacrylate groups (Bevalod 6464) | 1.6 | parts |
| Methylene bis acrylamide | 0.27 | parts |

This mixture was coated onto 0.1 mm thick polyethylene foil using a bar wound with wire 0.375 mm in diameter and allowed to dry at room temperature.

The following compounds were mixed together:

| | | |
|---|---|---|
| Polyvinyl acetate copolymer (Emultex AC43 ex Harlow Chemical Co.) | 5.4 | parts |
| Water | 8.56 | parts |
| 66% TiO₂ dispersion in water | 13.75 | parts |
| Polyvinyl acetate homopolymer (Mowilith DHL) | 18.75 | parts |
| Polyvinyl acetate copolymer (Vinnapas MV70H ex Wacker Chemie GmbH) | 5 | parts |
| 50% Benzildimethyl ketal (Irgacure 651 ex CIBA-GEIGY) in acetone | 5 | parts |
| 25% by weight polyvinyl alcohol solution in water (Gohsenol GL03) | 5.6 | parts |
| Methylene bis acrylamide | 0.18 | parts |
| Acrylic copolymer containing pendant glycidyl methacrylate groups (Bevaloid 6464) | 1.08 | parts |

This mixture was coated onto the coating of the previous mixture using a bar wound with wire diameter 0.55 mm. This final coat was dried at 30° C. The resultant material was exposed to a negative placed in contact with the polyethylene sheet to a 2 kw mercury-metal halide lamp for 3 minutes. The image was revealed when the coating was spray washed with warm water (30°-45° C.).

After drying the resultant image was placed in contact with a sheet of polymethylmethacrylate and a sheet of aluminium foil was placed in contact with the polyethylene substrate. This assembly was passed through a pair of nip rollers heated to 160° C. at a speed of 1.2 meters/min. The substrate could then be peeled away leaving the image adhering to the polymethylmethacrylate strip. Alternatively, the following method could be employed.

An adhesive was made by mixing the following compounds in a ball mill:

35 parts by weight of a low molecular weight polyvinyl isobutyl ether.
40 parts by weight of a medium molecular weight polyvinyl isobutyl ether.
25 parts by weight of finely divided silica.

This mixture was then diluted with nine times its weight of a mixture of white spirit and oxitol (90:10 by weight) to give a suitable consistency for coating. The adhesive was applied using a bar wound with wire 0.375 mm in diameter. Imagewise exposure followed by washout with water left a self adhesive image. The design could then be transferred to a carrier sheet of polyethylene terephthalate and could then be transferred as described in Example 1.

The present invention includes not only the sign manufacturing methods defined above, but also includes photosensitised materials which comprise an image forming layer based on a thermoplastic polymer and which can be imagewise exposed and developed to give heat-transferable indicia, and transfer materials formed from those photosensitised materials by imagewise exposure and development, and, if desired, application of adhesive.

We claim:
1. The method of manufacturing a subsurface sign legend which comprises
forming a composite material by applying to a coating layer a transparent or translucent substrate, said coating layer comprising a photosensitized organic polymeric material whose adhesion to the substrate increases on exposure to light, imagewise exposing the composite material through the substrate to a sign legend whereby the adhesion of the polymeric material to the substrate in the areas exposed to light is increased, and developing the imagewise exposed material by application of a water spray to remove the polymeric composition from the unexposed areas to leave a legend formed in sign indicia on said substrate, bringing a light transmitting plastic surface into contact with the exposed surface of the legend on the substrate to form a laminate, and applying sufficient heat and pressure to said laminate to form a bond between the light transmitting surface and the indicia which is stronger than the bond between the indicia and the substrate, and thereafter stripping the substrate away from the indicia.

2. The method of claim 1 wherein the photographically sensitised material is one which, on exposure and development and optionally the subsequent application of adhesive constitutes a dry transfer material and wherein following imagewise exposure and development the legend is transferred to an intermediate temporary support and thereafter the intermediate support bearing the legend and the light-transmitting sheet are brought together under the action of heat and pressure to adhere the legend to the light-transmitting sheet, and the temporary support is thereafter removed.

3. The method of claim 1 wherein the photographically sensitive material comprises a carrier foil and a photosensitive layer which, following imagewise exposure and development, may be adhered directly to the surface of the light-transmitting sheet under the action of heat and pressure more strongly than the photosensitive layer adheres to the carrier foil.

4. The method of claim 1 wherein the legend is built up on the photographically sensitive material by photosetting.

5. The method of claim 1 wherein between the steps of producing the legend and adhering it to the light-transmitting sheet, the legend is coloured.

6. The method of claim 5 wherein the photographically sensitive material on imagewise exposure produces a white legend and wherein the legend is coloured by dying the white legend using dyestuffs.

7. The method of claim 5 wherein the photographically sensitive material on imagewise exposure produces a white legend and wherein the legend is coloured by the application of a coloured blocking foil.

8. The method of claim 1 wherein after the application of the legend to the light-transmitting sheet, it is covered by a layer or coating to provide a contrasting background against which the legend is visible through the light-transmitting sheet.

9. The method of claim 1 wherein said photosensitized organic polymer comprises a diazo resin sensitized composition.

10. The method of claim 1 wherein said indicia comprises a thermoplastic polymer.

11. The method of manufacturing a subsurface sign which comprises applying to a light transmitting substrate a first layer of material comprising a photosensitive organic polymeric composition whose adhesion to the substrate increases on exposure to light;

applying over the first layer a second layer of adhesive material, exposing the composite material so formed through the substrate to a sign legend image to increase the adhesion of the first layer to the substrate in the areas exposed to light;

spraying the adhesive surface with water to fully remove the first and second layers in the unexposed areas and to leave a positive sign legend on said substrate, each element of said legend consisting of an individually transferable indicia, transferring said legend from said substrate to a temporary support sheet by applying pressure to the rear surface of the substrate in the vicinity of said indicia to create a bond between said indicia and said temporary support sheet greater than the bond between said indicia and said substrate, bringing the transferred indicia on the temporary support sheet into contact with the surface of a light transmitting sign sheet under sufficient heat and pressure to create a bond between said indicia and said sign sheet that is stronger than said bond between said indicia and said temporary support sheet and to cause said transferred indicia to adhere to the sign sheet surface more strongly than to said temporary support, and removing the temporary support sheet from said indicia to leave said indicia in sign legend order on the bottom surface of the sign sheet.

12. The method of claim 11, wherein said photosensitive organic polymer layer comprises a diazo resin sensitized polyvinly alcohol/vinyl acetate polymer.

13. The method of claim 11 wherein said photosensitized layer comprises a thermoplastic polymer.

14. The method of claim 11 wherein said adhesive layer comprises a dry transfer adhesive composition.

* * * * *